United States Patent
Saitoh

Patent Number: 5,858,824
Date of Patent: Jan. 12, 1999

[54] METHOD OF FORMING FINE ELECTRODE ON SEMICONDUCTOR SUBSTRATE

[75] Inventor: Yoshiharu Saitoh, Tokyo, Japan

[73] Assignee: NEC Corporation, Tokyo, Japan

[21] Appl. No.: 876,204

[22] Filed: Jun. 16, 1997

[30] Foreign Application Priority Data

Jun. 14, 1996 [JP] Japan .................................. 8-175673

[51] Int. Cl.$^6$ .................................................. H01L 21/338
[52] U.S. Cl. ........................... 438/167; 438/182; 438/574; 438/577; 438/701
[58] Field of Search ..................................... 438/167, 180, 438/182, 577, 572, 574, 700, 701

[56] References Cited

U.S. PATENT DOCUMENTS 5,041,397  8/1991  Kim et al. ............................... 438/701

Primary Examiner—Tuan H. Nguyen
Attorney, Agent, or Firm—Sughrue, Mion, Zinn, Macpeak & Seas, PLLC

[57] ABSTRACT

A dielectric film is formed on a semiconductor substrate, and on the dielectric film an inorganic dielectric mask film is deposited by CVD. The mask film comprises a first component which is relatively high in etch rate by isotropic plasma etching and a second component relatively low in etch rate, and the content of the first component is linearly gradient in the film thickness direction so as to become lowest at the interface between the mask film and the underlying dielectric film. For example, the mask film is a phosphosilicate glass ($P_2O_5$—$SiO_2$) film. A resist film is formed on the mask film, and a window is opened in the resist film by electron beam lithography. Then a window is opened in the mask film by isotropic plasma etching, and the underlying dielectric film is also etched to form a window under the window in the mask film. In cross section, the window in the mask film is tapered toward the substrate by the effect of the gradient of the content of the first component in the mask film. So, the width of the window in the underlying dielectric film becomes narrower than the width of the window in the resist film. After removing the resist film and the mask film, a metal film is deposited on the exposed dielectric film so as to fill the narrow window. This method is useful for forming a T-shaped gate electrode of a heterojunction FET in which the gate length can be shortened to the extent of about 0.05 $\mu$m.

9 Claims, 6 Drawing Sheets

METHOD OF FORMING FINE ELECTRODE ON SEMICONDUCTOR SUBSTRATE

BACKGROUND OF THE INVENTION

This invention relates to a method of forming a fine electrode on a semiconductor substrate. The method is particularly suitable for forming a so-called T-shaped gate electrode of a heterojunction field-effect transistor (FET) with a very short gate length.

Heterojunction FETs are known as low-noise transistors and have been used, for example, in parabolic antennas for receiving satellite broadcast. Recently there is a demand for further improvements in the low-noise characteristics of FETs.

In general, for improving the low-noise characteristics of a FET in high-frequency bands such as microwave bands it is effective to shorten the gate length. However, shortening of the gate length leads to narrowing of the cross-sectional area of the gate and hence causes an increase in a parasitic resistance in the gate region in the direction of the high-frequency wave propagation. Such a resistance is called gate resistance. If the gate resistance increases, the high-frequency signal gain of the FET decreases.

In recent heterojunction FETs, a T-shaped gate structure is employed in order to shorten the gate length and decrease the gate resistance. In this gate structure, the gate electrode is T-shaped in cross section. The stem part of the T-shaped gate electrode stands on the substrate so that the arm part extends above the substrate. The gate length is determined by the width of the stem part. For further improvements in the low-noise characteristics of heterojunction FETs it is desired to decrease the width of the stem part of the T-shaped gate electrode.

Electron beam lithography is useful for defining very fine gate electrode patterns, but the resolution of electron beam lithography is limited at about 0.1 $\mu$m. On the other hand, it is desired to form a T-shaped gate electrode shorter than 0.1 $\mu$m in gate length. To accomplish this desire by using electron beam lithography, some special techniques are required.

In the accompanying drawings, FIGS. 6(A) to 6(F) illustrate a recently developed process for forming a T-shaped gate electrode by which the gate length is shortened to the extent of about 0.07 $\mu$m.

Referring to FIG. 6(A), on a GaAs substrate 50 an insulating film 52 such as a silicon dioxide film or a silicon nitride film is formed, and a resist film 54 (will be referred to as EB resist film) for electron beam lithography is formed on the insulating film 52. In a region for forming a gate electrode, a window 56 is opened in the resist film 54 by electron beam exposure and subsequent development. The width D of the window 56 is 0.1 $\mu$m.

Next, as shown in FIG. 6(B), a relatively thick resist film 58 (will be referred to as UV resist film) for ultraviolet ray lithography is formed over the entire area of the EB resist film 54 including the opening 56. At the interface between the UV resist film 58 and the already developed EB resist film 54, chemical reactions take place to form an intermediate layer 60 which differs in chemical composition from both the EB resist film 54 and the UV resist film 58. In the window 56 in the EB resist film 54, the intermediate layer 60 provides a sidewall. The thickness of the intermediate layer 60 is about 0.015 $\mu$m.

Referring to FIG. 6(C), a window 62 for a T-shaped gate electrode is formed in the UV resist film 58 by a conventional image reversal method which includes the following process steps. It is assumed that the UV resist film 58 is a positive resist film. First, the UV resist film 58 is exposed to UV rays except in the area for the window 62. In the exposed region the UV resist film 58 becomes soluble in a developer solution (an alkali solution). Then, ammonia gas is applied to the UV resist film over the entire area. In the region exposed to UV rays, the resist film 58 reacts with ammonia gas and gradually becomes insensitive to UV rays and insoluble in developer solutions. Since the reaction starts on the surface of the UV resist film 58 and gradually proceeds in the film thickness direction, the extent of the changes in the sensitivity and solubility of the UV resist film becomes smaller as the depth from the film surface increases. Next, the whole area of the UV resist film 58 is exposed to UV rays. As a result, the UV resist film becomes soluble in a developer solution only in the area for forming the window 62. Then the UV resist film is developed to form the window 62. In cross section, the window 62 becomes inversely tapered toward the substrate because in the initially exposed region of the resist film 58 the extent of lowering of solubility by reaction with ammonia gas was inversely proportional to the depth from the UV resist film surface.

The intermediate layer 60 is insoluble in the developer solution and hence remains on the EB resist film 54. In the window 56 in the EB resist film 54, the intermediate layer 60 remains as a sidewall. Therefore, the effective width D' of the window 56 in FIG. 6(C) is narrower than the initial width D of the window 56 in FIG. 6(A). When D is 0.1 $\mu$m and the thickness of the intermediate layer 60 is about 0.015 $\mu$m, D' becomes about 0.07 $\mu$m.

Next, as shown in FIG. 6(D), a window 66 is opened in the insulating film 52 under the window 56 in the EB resist film 54 by dry etching. Furthermore, under the window 66, a recess 68 is formed in the GaAs substrate 50 by dry etching. In these dry etching processes the intermediate layer 60 serves as an etch mask. The recess 68 in the substrate serves the purpose of reducing the unfavorable influences of a surface depletion layer right beneath the gate electrode.

Referring to FIG. 6(E), a gate electrode metal 70 such as, for example, WSi is deposited on the UV resist film 58 by directional sputtering. In the window 62 in the resist film 58, the metal 70 deposits on the intermediate layer 60, fills the window 56 in the resist film 54 and reaches the bottom of the recess 68 in the substrate through the window 66 in the insulating film 52. The metal film 70 deposited in the window 62 forms a T-shaped gate electrode. Since the cross section of the window 62 is tapered upward, the cross section of the metal film 70 deposited on the intermediate layer 70 is tapered upward. This is favorable for planarization of an interlayer insulator film (not shown) formed over the gate electrode.

After that, the UV resist film 58 is removed together with the overlying metal film 70 by a lift-off technique, and the intermediate layer 60 and the EB resist film 54 are removed. FIG. 6(F) shows the T-shaped gate electrode 70 formed by the above-described process. With this gate electrode, the gate length L is equal to the width D' of the opening 56 in FIG. 6(C). That is, by this process the gate length L is shortened to the extent of about 0.07 $\mu$m by using the intermediate layer 60 as a sidewall in the opening 56 for defining the base part of the gate electrode.

However, the above-described process is not fully satisfactory for several reasons. First, the gate length cannot be made shorter than about 0.07 $\mu$m because the intermediate layer 60 does not become thicker than about 0.015 $\mu$m and undergoes etching when the insulating film 52 and the substrate are etched to form the window 66 and the recess 68. Second, it is difficult to accurately control the gate length because the composition and thickness of the intermediate layer 60 depend on many factors in the reaction between an EB resist and a UV resist. In the case of mass production, reproducibility of the intermediate layer will not be good, and therefore the yield of the aimed gate electrode will be insufficient.

SUMMARY OF THE INVENTION

It is an object of the present invention to provide a method for forming a fine electrode on a semiconductor substrate and particularly to provide a method for forming a T-shaped gate electrode of a heterojunction FET in which the gate length can be shortened to the extent of about 0.05 μm with good reproducibility.

For forming an electrode on a semiconductor substrate, a method according to the invention comprises the following steps: (a) forming a dielectric film on the substrate, (b) forming an inorganic dielectric mask film on the initially formed dielectric film, (c) forming a resist film on the mask film, (d) opening a window in the resist film by lithography, (e) etching the mask film by isotropic plasma etching through the window in the resist film to open a window in the mask film and then etching the dielectric film under the window in the mask film to open a window in the dielectric film, (f) removing the resist film and the mask film to expose the underlying dielectric film, and (g) depositing a metal film on the dielectric film so as to fill the window in the dielectric film with the deposited metal film. In this method, the inorganic dielectric mask film formed in step (b) comprises a first component which is relatively high in etch rate by isotropic plasma etching and a second component which is relatively low in etch rate by the same isotropic plasma etching, and the content of the first component in the mask film is gradient in the film thickness direction so as to become lowest at the interface between the mask film and the underlying dielectric film and highest at the upper surface of the mask film. By the effect of the gradient of the content of the first component in the mask film, the window opened in the mask film is tapered toward the underlying dielectric film. Therefore, the width of the window in the underlying dielectric film becomes smaller than the width of the window in the resist film.

In preferred embodiments of the invention, the inorganic dielectric mask film is a phosphosilicate glass (PSG: $P_2O_5$—$SiO_2$ glass) film wherein $P_2O_5$ is the above-mentioned first component or a silicon oxynitride ($Si_3N_4$—$SiO_2$) film wherein $Si_3N_4$ is the first component. The PSG film or the silicon oxynitride film is formed by a chemical vapor deposition (CVD) process, and the desired gradient of the content (molar fraction) of $P_2O_5$ or $Si_3N_4$ in the deposited film is realized by gradually varying the feed rate of a selected reactant gas. The gradient can accurately be controlled by controlling the flow rate of the reactant gas in question. Therefore, in this invention the tapering of the window in the mask film can accurately be controlled with good reproducibility, and hence a narrow window can be opened in the dielectric film under the mask film with high accuracy and good reproducibility.

To form a fine electrode by the method according to the invention it is preferable to employ electron beam lithography in the above-described steps (c) and (d). By electron beam lithography it is possible to open a window as narrow as about 0.1 μm in the resist film, and in that case the width of the window in the dielectric film on the substrate surface can be reduced to the extent of about 0.05 μm. That is, by this method it is possible to form an electrode which is as short (or narrow) as about 0.05 μm on the substrate surface.

The method according to the invention is useful for forming a T-shaped gate electrode of a heterojunction FET and makes it possible to shorten the gate length to about 0.05 μm.

DESCRIPTION OF THE PREFERRED EMBODIMENTS

As an embodiment of the invention, a process of forming a T-shaped gate electrode of a heterojunction FET is illustrated in FIGS. 1(A) to 1(H).

Figure 1A:
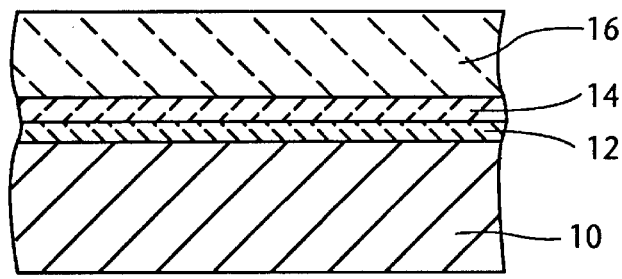
FIGS. 1(A) to 1(H) illustrate, in schematic cross-sectional views, a process sequence according to the invention for forming a T-shaped gate electrode.

Referring to FIG. 1(A), on a GaAs substrate 10 a silicon nitride film 12 and a silicon dioxide film 14 are deposited one after another each by low-temperature CVD. For example, the nitride film 12 is about 0.05 μm in thickness and the oxide film 14 is about 0.1 μm. Then a relatively thick film of PSG 16 is deposited on the oxide film 14 by low-temperature atmospheric-pressure CVD. For example, the thickness of the PSG film 16 is about 1.0 μm.

PSG formed by CVD is an amorphous mixture of silicon dioxide ($SiO_2$) and phosphorus (V) oxide ($P_2O_5$). So, the composition of PSG can be represented by the following formula.

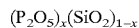

$$(P_2O_5)_x(SiO_2)_{1-x}$$

Figure 2:
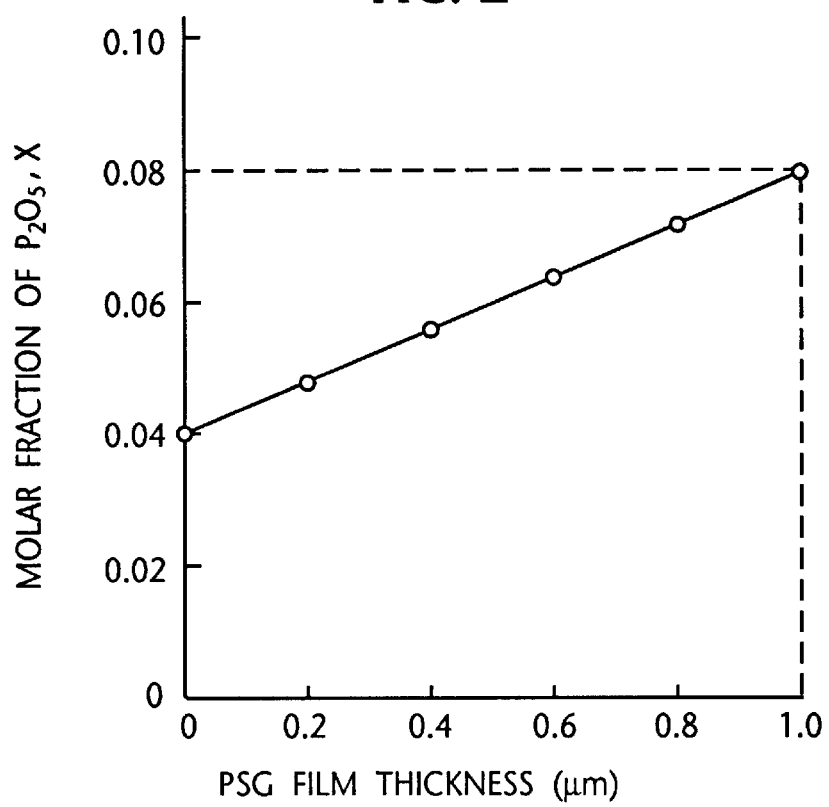
FIG. 2 is a graph showing a gradient of molar fraction of $P_2O_5$ in a phosphosilicate glass film deposited in the process of FIGS. 1(A) to 1(H)

In this embodiment, the PSG film 16 is deposited such that the molar fraction (x) of $P_2O_5$ in the PSG film 16 increases monotonously from the interface between the PSG film 16 and the silicon oxide film 14 toward the upper surface of the film 16. For example, at the start of the deposition of the PSG film 16 the molar fraction x is set at 0.04, and x is linearly increased with the growth of the film 16 such that x reaches 0.08 at the end of the film growth where the film 16 has a thickness of 1.0 μm. In the obtained PSG film 16, there is a gradient of x in the thickness direction as shown in FIG. 2.

The molar fraction x of $P_2O_5$ in the PSG film 16 is controlled by controlling the feed rate of the phosphorus source in the CVD process. In depositing a PSG film by low-temperature atmospheric-pressure CVD, it is usual to use monosilane ($SiH_4$), oxygen ($O_2$) and phosphine ($PH_3$) as reactant gases. At a temperature of about 300° C. the mixed reactant gases undergo reactions represented by the equations (1) and (2), and as a result a PSG film is deposited on the substrate.

$$SiH_4 + 2O_2 \rightarrow SiO_2 + 2H_2O\uparrow \quad (1)$$

$$2PH_3 + 4O_2 \rightarrow P_2O_5 + 3H_2O\uparrow \quad (2)$$

Therefore, the content of $P_2O_5$ in the PSG film depends on the partial pressure of phosphine gas in the mixture of the reactant gases. To deposit the PSG film 16 with the desired gradient of the molar fraction x of $P_2O_5$, the flow rate of phosphine gas is gradually increased during the deposition process so that x may gradually increase from 0.04 at the start of deposition to 0.08 in the lapse of a predetermined length of time for depositing PSG to a thickness of 1 μm.

Figure 1B:
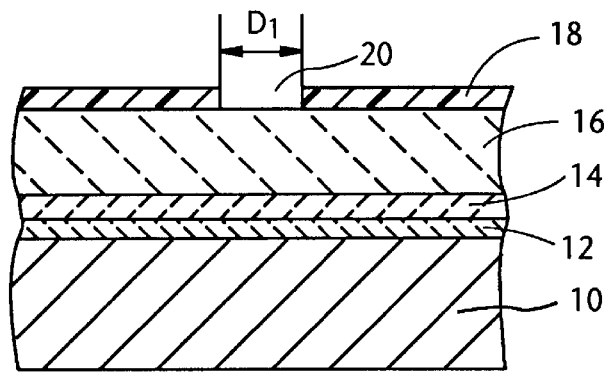

Referring to FIG. 1(B), an EB resist film 18 is formed on the PSG film 16. In a region for forming a gate electrode, a window 20 is opened in the EB resist film 18 by electron beam exposure and subsequent development. The width $D_1$ of the window 20 is 0.1 μm.

Figure 1C:
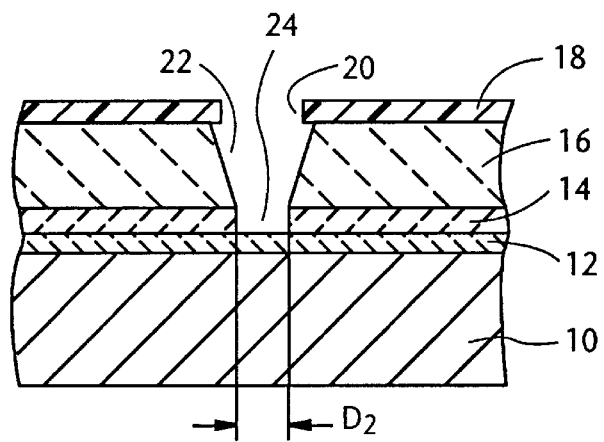

Referring to FIG. 1(C), using the window 20 in the EB resist film 18, the PSG film 16 is subjected to isotropic plasma etching to open a window 22. The EB resist film 18 serves as an etch mask. In isotropic plasma etching, a plasma generated by glow discharge in $CF_4$ gas is used to etch the PSG film 16. In the PSG film 16, $P_2O_5$ is higher than $SiO_2$ in reactivity with fluorine radical ($F^*$) contained in the plasma and readily undergoes reaction as represented by the equation (3) to turn into $PF_3$ which is volatile.

$$2P_2O_5 + 3CF_4 \rightarrow 4PF_3 + 3CO_2\uparrow + 2O_2\uparrow \quad (3)$$

Figure 3:
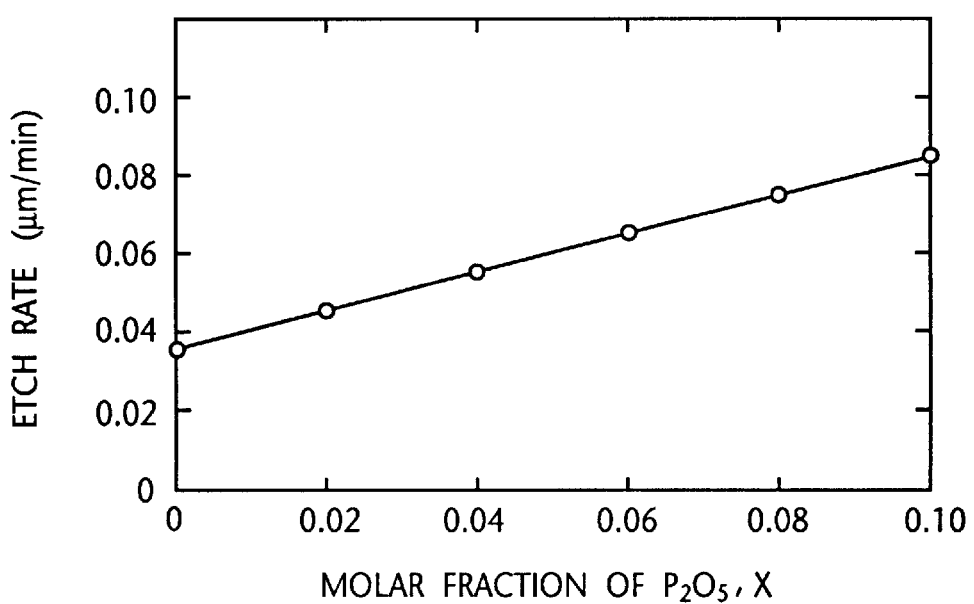
FIG. 3 is a graph showing the dependence of etch rate of a phosphosilicate glass film on the molar fraction of $P_2O_5$.

Therefore, the etch rate of PSG in $CF_4$ plasma becomes higher as the content of $P_2O_5$ in PSG increases. FIG. 3 shows the relationship between the molar fraction x of $P_2O_5$ in a PSG film and the etch rate of the PSG film in a $CF_4$ plasma. The experiment was made in a single-wafer parallel-plate plasma etching apparatus with power supply system of anode coupling type. The excitation power was 100 W. It is seen that the etch rate increases in direct proportion to the molar fraction x of $P_2O_5$. In the PSG film 16 in FIG. 1(C) the molar fraction x is gradient and linearly decreases from the upper surface toward the interface between the silicon dioxide film 14. In isotropic plasma etching of the PSG film 16, side etching accompanies the vertical etching. The etch rate of the side etching lowers with a decrease in the value of x. Therefore, the effect of side etching decreases as the vertical etching of the film 16 proceeds. As a result, the cross section of the window 22 is tapered (i.e., becomes narrower in width) toward the substrate 10. After forming the tapered window 22 the isotropic plasma etching is further continued to etch the silicon oxide film 14 until a window 24 opens in the film 14. Thus, together with the resist film 18 the windowed PSG film 16 serves as a mask in etching the silicon oxide film 14. Since the window 22 is tapered, the width $D_2$ of the window 22 at the bottom is smaller than the width $D_1$ (0.1 μm) of the window 20 in the resist film 18, and the width of the window 24 in the silicon oxide film is nearly equal to $D_2$. In this example, $D_2$ becomes about 0.05 μm.

Figure 1D:
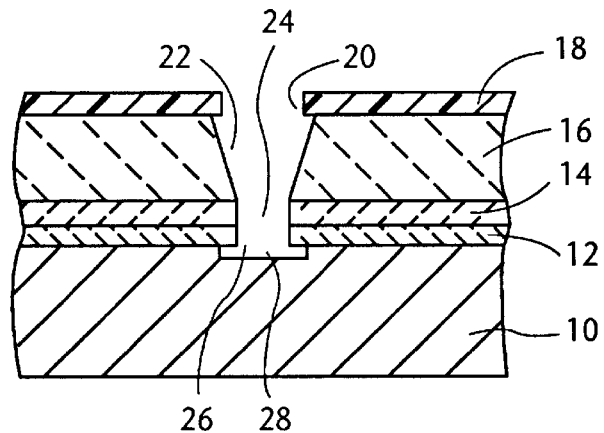

Next, as shown in FIG. 1(D), a window 26 is opened in the silicon nitride film 12 under the window 24 in the silicon oxide film 14. This is accomplished by vertically etching the silicon nitride film 12 by an anisotropic dry etching method wherein the laminate of the EB resist film 18, PSG film 16 and silicon oxide film 14 serves as a mask. Furthermore, a surface region of the GaAs substrate 10 is etched to form a recess 28 under the window 24 in the silicon nitride film 12.

Figure 1E:
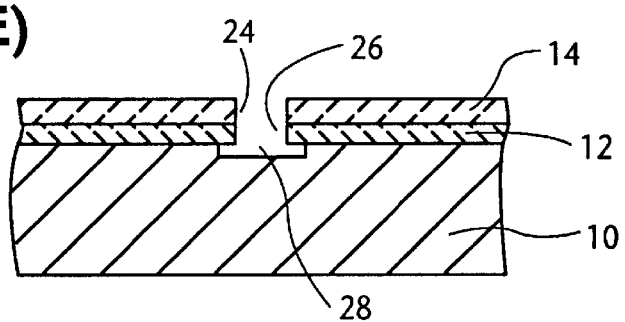

Next, as shown in FIG. 1(E), the resist film 18 is removed, and then the PSG film 16 is removed by etching.

Figure 1F:
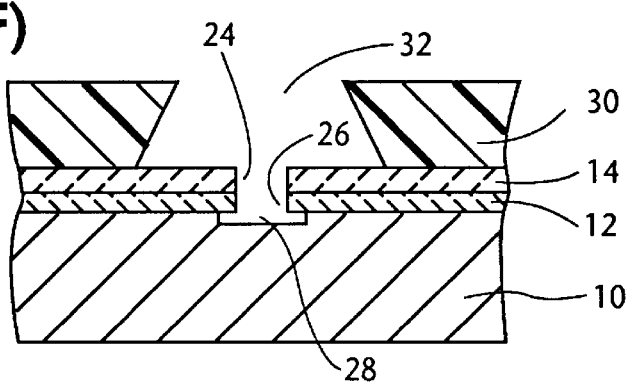

Next, as shown in FIG. 1(F), a UV resist film 30 is formed on the silicon oxide film 14, and, above the window 24 in the silicon oxide film 14, a relatively wide window 32 for a T-shaped gate electrode is formed in the resist film 30. The window 32 is formed by the image reversal method described with respect to the prior art illustrated in FIGS. 6(A) to 6(F). As a result, the cross section of the window 30 is inversely tapered toward the substrate 10.

Figure 1G:
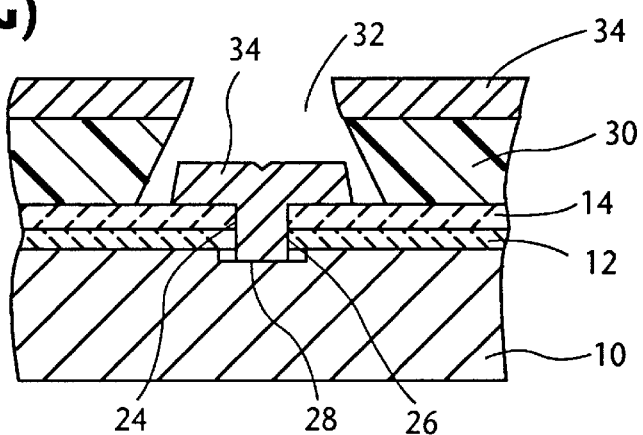

Referring to FIG. 1(G), a gate electrode metal 34 such as, for example, WSi is deposited on the UV resist film 30 by directional sputtering. In the window 34 in the resist film 30, the metal 30 deposits on the silicon oxide film 14, fills the windows 24, 26 in the silicon oxide and silicon nitride films 12, 14 and reaches the bottom of the recess 28 in the substrate 10. Since the cross section of the window 32 is tapered upward, the cross section of the metal film 34 deposited on the silicon oxide film 14 is tapered upward. The metal film 34 deposited in the window 32 forms a T-shaped gate electrode.

Figure 1H:
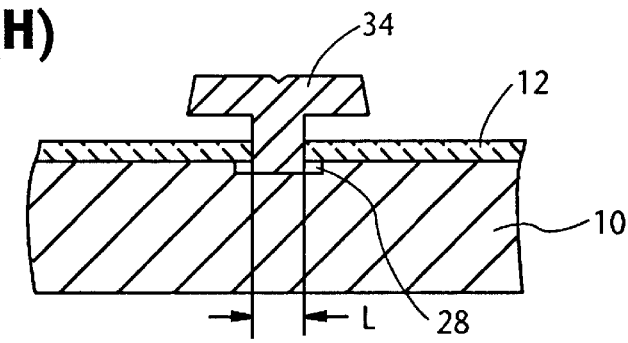

After that, the UV resist film 30 is removed together with the overlying metal film 34 by a lift-off technique, and the silicon oxide film 14 is removed. FIG. 1(H) shows the T-shaped gate electrode 34 formed by the above-described process. With this gate electrode, the gate length L is equal to the bottom width $D_2$ of the tapered opening 22 in FIG. 1(C). That is, in this example the gate length L is about 0.05 μm. Although the limit of the resolution of an EB resist film is at about 0.1 μm, the tapered window 22 in the PSG film 16 leads to a success in shortening the gate length L to the extent of about 0.05 μm.

In the process illustrated in FIGS. 1(A) to 1(H), it is an option to replace the PSG film 16 by a silicon oxynitride (abbreviated to SiON) film. A SiON film deposited by CVD is an amorphous mixture of $SiO_2$ and $Si_3N_4$ and can be represented by the following formula.

$$(SiO_2)_{1-y}(Si_3N_4)_y$$

Figure 4:
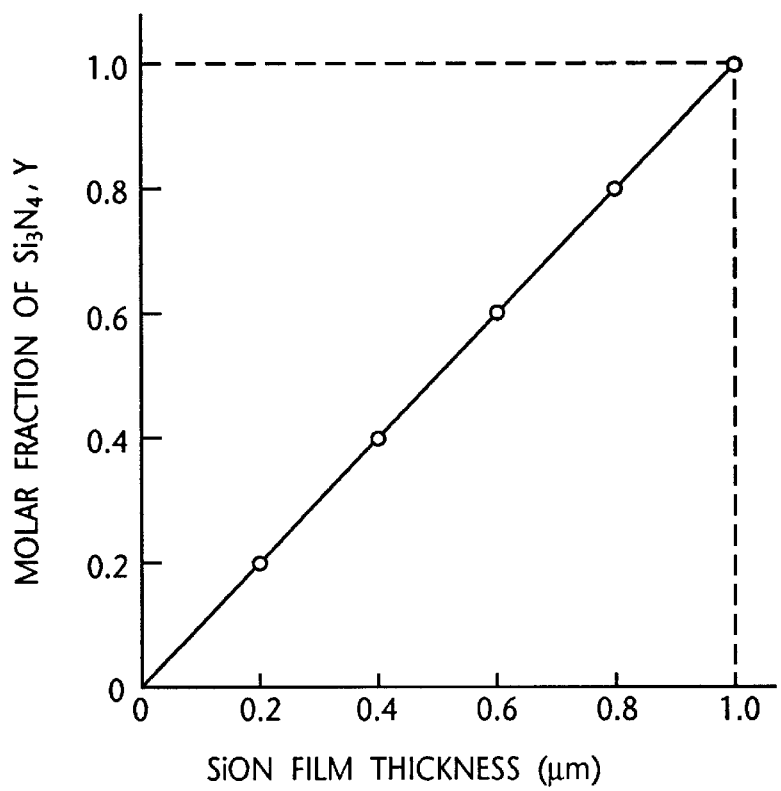
FIG. 4 is a graph showing a gradient of molar fraction of $Si_3N_4$ in a silicon oxynitride film deposited in another embodiment of the invention.

In depositing the SiON film, the molar fraction y of $Si_3N_4$ is linearly increased in the thickness direction. For example, the SiON film is 1.0 μm in thickness, and y is 0 at the interface between the SiON film and the silicon oxide film 14 and becomes 1.0 at the upper surface of the SiON film. In this case, the gradient of y in the SiON film is as shown in FIG. 4.

In depositing a SiON film by low-temperature plasma-enhanced CVD, it is usual to use monosilane ($SiH_4$), nitrous oxide ($N_2O$) and ammonia ($NH_3$) as reactant gases. The deposition temperature is about 200° C. The mixed reactant gases undergo reactions represented by the equations (4) and (5), and as a result a SiON film is deposited on the substrate.

$$SiH_4 + 4N_2O \rightarrow SiO_2 + 2H_2O\uparrow + 4N_2\uparrow \quad (4)$$

$$3SiH_4 + 4NH_3 \rightarrow Si_3N_4 + 12H_2\uparrow \quad (5)$$

Therefore, the content of $Si_3N_4$ in the SiON film can be controlled by controlling the flow rate of the ammonia gas. To deposit the SiON film with the gradient of the molar fraction y of $Si_3N_4$ as shown in FIG. 4, the feed of ammonia gas is omitted at the start of the deposition process. Then the flow rate of ammonia gas is gradually increased during the deposition process, and the flow rate of nitrous oxide gas is correspondingly decreased. The flow rates of ammonia gas and nitrous oxide gas are controlled so that y may gradually increase from 0 at the start of deposition to 1.0 in the lapse of a predetermined length of time for depositing SiON to a thickness of 1 μm. At the end of deposition the flow rate of nitrous oxide gas becomes 0.

Figure 5:
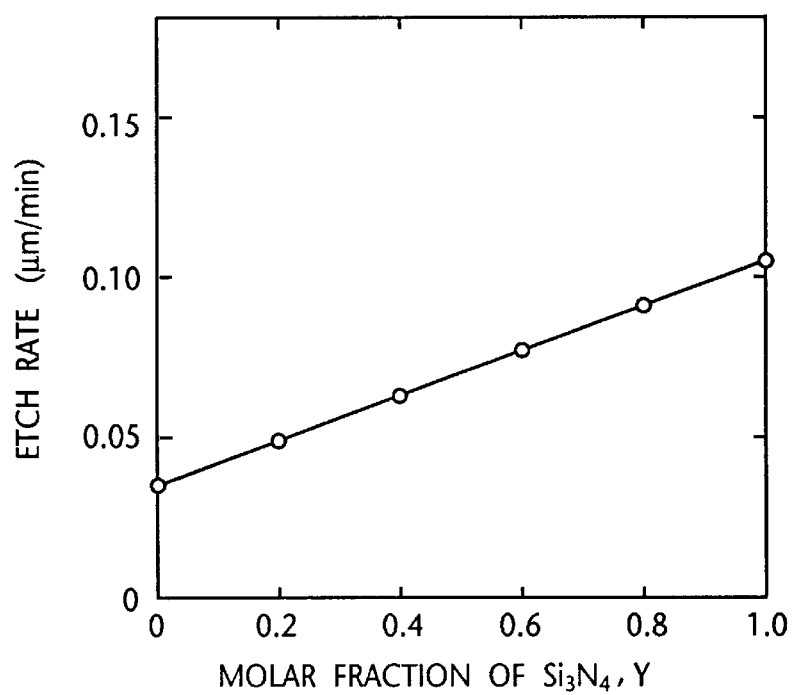
FIG. 5 is a graph showing the dependence of etch rate of a silicon oxynitride film on the molar fraction of $Si_3N_4$.
Figure 6A:
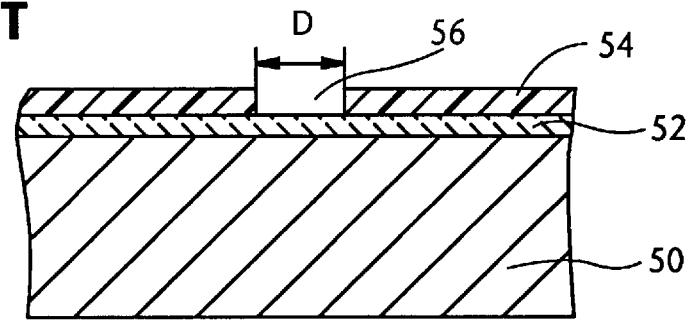
FIGS. 6(A) to 6(F) illustrate, in schematic cross-sectional views, a known process sequence for forming a T-shaped gate electrode.
Figure 6B:
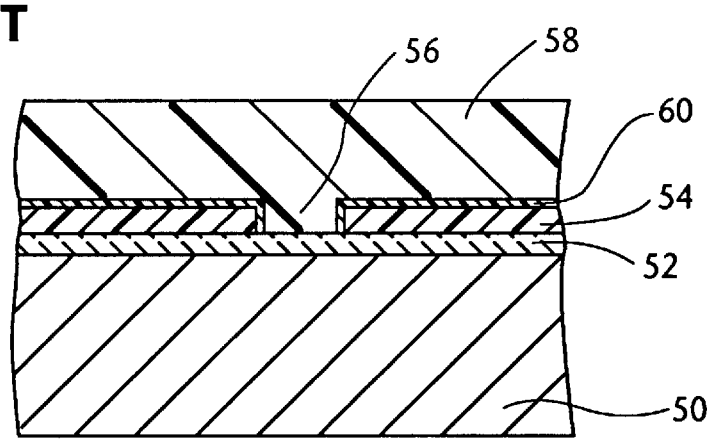
Figure 6C:
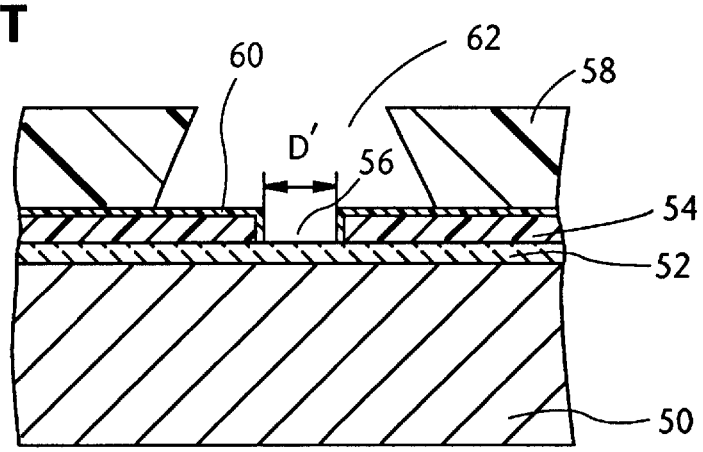
Figure 6D:
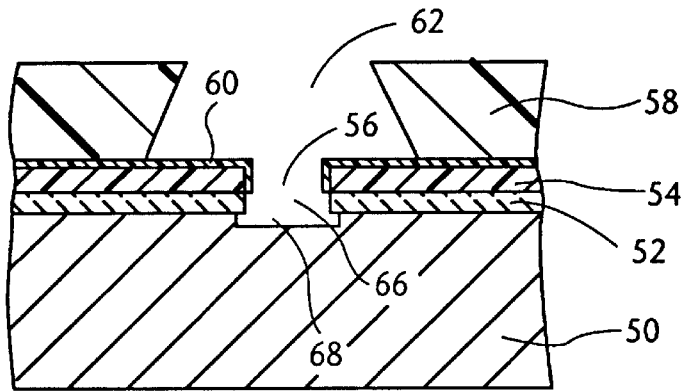
Figure 6E:
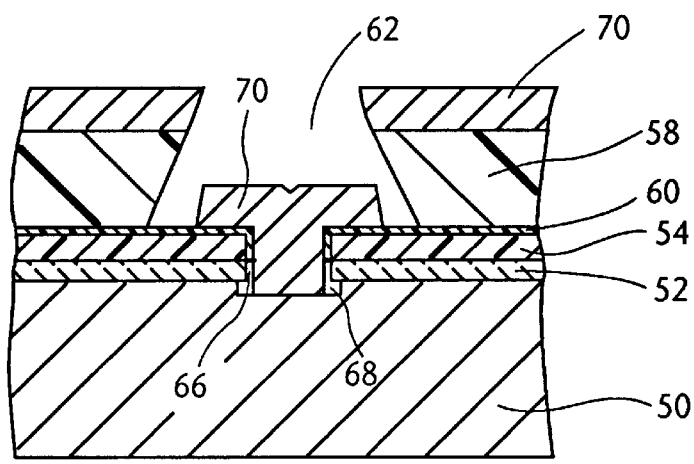
Figure 6F:
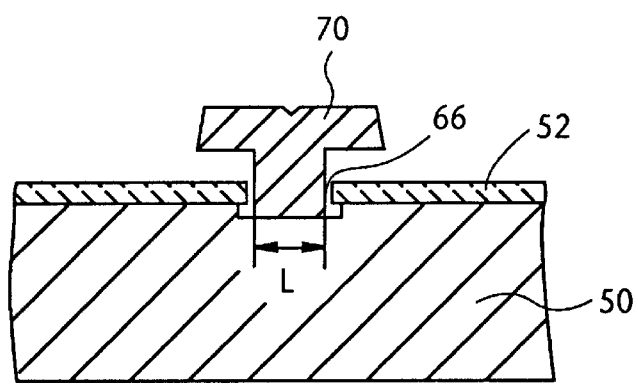

In etching the SiON film with a $CF_4$ plasma, $Si_3N_4$ is very higher in reactivity than $SiO_2$. So, as shown in FIG. 5, the etch rate of the SiON film in a $CF_4$ plasma is in direct proportion to the molar fraction y of $Si_3N_4$ in the SiON film. Therefore, in forming a window (the window 22 in FIG. 1(C)) in the SiON film by isotropic plasma etching, the etch rate of side etching decreases as the etch depth from the film surface increases. As a result, the cross section of the window is tapered toward the substrate, as shown in FIG. 1(C), so that the width ($D_2$) of the window 24 in the silicon oxide film 14 under the SiON film becomes about 0.05 μm when the width $D_1$ of the window 20 in the UV resist film 18 is 1.0 μm.

A SiON film can be deposited by plasma-enhanced CVD at a relatively low temperature such as about 200° C., whereas a PSG film is deposited at about 300° C. by atmospheric-pressure CVD. Because of the lower deposition temperature, thermal stresses can be reduced by using a SiON film, and this is favorable for the prevention or suppression of degradation of the characteristics and reliability of the semiconductor devices on the substrate.

What is claimed is:

1. A method of forming an electrode on a semiconductor substrate, comprising the steps of:

(a) forming a dielectric film on the substrate;

(b) forming an inorganic dielectric mask film on said dielectric film, the inorganic dielectric mask film comprising a first component which is relatively high in etch rate by isotropic plasma etching and a second component which is relatively low in etch rate by said isotropic plasma etching, the content of said first component in the mask film being gradient in the film thickness direction so as to become lowest at the interface between said mask film and said dielectric film and highest at the upper surface of said mask film;

(c) forming a resist film on said mask film;

(d) forming a window in said resist film by lithography;, (e) etching said mask film by isotropic plasma etching through said window in said resist film to open a window in said mask film and then etching said dielectric film under the window in said mask film to open a window in said dielectric film, said window in said mask film being tapered toward said dielectric film by the effect of the gradient of the content of said first component in said mask film, whereby the width of said window in said dielectric film becomes smaller than the width of said window in said resist film;

(f) removing said resist film and said mask film to expose said dielectric film; and (g) depositing a metal film on said dielectric film so as to fill said window in said dielectric film with the deposited metal film.

2. A method according to claim 1, wherein the content of said first component in said mask film is linearly increasing from said interface toward the upper surface of the mask film.

3. A method according to claim 1, wherein said inorganic dielectric mask film is a phosphosilicate glass film which is formed by chemical vapor deposition and comprises $P_2O_5$ as said first component and $SiO_2$ as said second component.

4. A method according to claim 1, wherein said inorganic dielectric mask film is a silicon oxynitride film which is formed by chemical vapor deposition and comprises $Si_3N_4$ as said first component and $SiO_2$ as said second component.

5. A method according to claim 1, wherein said resist film is an electron beam resist film and said lithography in step (d) is electron beam lithography.

6. A method of forming a cross-sectionally T-shaped gate electrode of a heterojunction field-effect transistor, comprising the steps of:

(a) forming a dielectric film on the substrate;

(b) forming an inorganic dielectric mask film on said dielectric film, the inorganic dielectric mask film comprising a first component which is relatively high in etch rate by isotropic plasma etching and a second component which is relatively low in etch rate by said isotropic plasma etching, the content of said first component in the mask film being gradient in the film thickness direction so as to become lowest at the interface between said mask film and said dielectric film and highest at the upper surface of said mask film;

(c) forming an electron beam resist film on said mask film;

(d) forming a window in said resist film by electron beam lithography;

(e) etching said mask film by isotropic plasma etching through said window in said resist film to open a window in said mask film and then etching said dielectric film under the window in said mask film to open a window in said dielectric film, said window in said mask film being tapered toward said dielectric film by the effect of the gradient of the content of said first component in said mask film, whereby the width of said window in said dielectric film becomes smaller than the width of said window in said resist film;

(f) removing said resist film and said mask film to expose said dielectric film;

(g) forming an ultraviolet resist film on said dielectric film;

(h) forming a gate electrode window in said ultraviolet resist film above said window in said dielectric film such that in cross section the gate electrode window is inversely tapered toward said dielectric film;

(i) depositing a metal film on said ultraviolet resist film and on said dielectric film exposed in said gate electrode window so as to fill said window in said dielectric film with the deposited metal film; and (j) removing said ultraviolet resist film together with the metal film deposited thereon.

7. A method according to claim 6, wherein the content of said first component in said mask film is linearly increasing from said interface toward the upper surface of the mask film.

8. A method according to claim 6, wherein said inorganic dielectric mask film is a phosphosilicate glass film which is formed by chemical vapor deposition and comprises $P_2O_5$ as said first component and $SiO_2$ as said second component.

9. A method according to claim 6, wherein said inorganic dielectric mask film is a silicon oxynitride film which is formed by chemical vapor deposition and comprises $Si_3N_4$ as said first component and $SiO_2$ as said first component.

* * * * *

UNITED STATES PATENT AND TRADEMARK OFFICE
CERTIFICATE OF CORRECTION

PATENT NO.: 5,858,824
DATED: January 12, 1999
INVENTOR(S): Yoshiharu SAITOH

It is certified that error appears in the above-identified patent and that said Letters Patent is hereby corrected as shown below:

Column 8, Line 64 delete "first: (second occurrence) and insert --second--

Signed and Sealed this

First Day of June, 1999

Attest:

Q. TODD DICKINSON

*Attesting Officer*     Acting Commissioner of Patents and Trademarks